United States Patent [19]
Van Anda et al.

[11] 3,975,699
[45] Aug. 17, 1976

[54] LINEAR ROLL-OFF FILTER NETWORK

[75] Inventors: James B. Van Anda, Willingboro; James S. Tyson, Belran, both of N.J.

[73] Assignee: The United States of America as represented by the Secretary of the Air Force, Washington, D.C.

[22] Filed: June 19, 1975

[21] Appl. No.: 588,553

[52] U.S. Cl. .......................... 333/70 R; 307/233 R; 328/167; 329/103; 329/140; 333/28 R
[51] Int. Cl.² ................................................ H03H 7/10
[58] Field of Search ........................ 333/28 R, 70 R; 307/233 R; 328/167; 329/103, 140, 145; 330/21, 31, 51

[56] References Cited
UNITED STATES PATENTS

| | | | |
|---|---|---|---|
| 2,719,272 | 9/1955 | Gannett | 333/70 R X |
| 2,895,111 | 7/1959 | Rothe | 333/28 R |
| 3,153,207 | 10/1964 | Brown | 333/70 R |
| 3,506,856 | 4/1970 | Toffler et al. | 333/28 R X |
| 3,821,654 | 6/1974 | Van Anrooy | 329/103 |

*Primary Examiner*—Eugene La Roche
*Attorney, Agent, or Firm*—Joseph E. Rusz; George Fine

[57] ABSTRACT

A linear filter network to provide improved distortion characteristics of a demodulated FM signal by direct synthesis of the linear amplitude transfer characteristic.

3 Claims, 2 Drawing Figures

LINEAR ROLL-OFF FILTER NETWORK

STATEMENT OF GOVERNMENT INTEREST

The invention described herein may be manufactured and used by or for the Government for governmental purposes without the payment of any royalty thereon.

BACKGROUND OF THE INVENTION

The present invention is comprised of circuitry which provides a linearly decreasing amplitude versus frequency characteristic but with a linear response. This type of response is commonly used in an FM video recorder in order to redistribute the FM carrier sideband, and noise energy in a manner that increases the demodulated video S/N ratio. The circuit function is referred to as a "linear roll-off filter".

The linear filter network of the present invention provides improved distortion characteristics of a demodulated FM signal by direct synthesis of the linear amplitude frequency transfer characteristic. It may be used for any type of FM system such as used for videotape recording.

SUMMARY OF THE INVENTION

A linear filter network is provided which includes a first unit gain buffer driver followed by a quadrature hybrid to divide the FM input signal into two equal signals, the first having a 90° phase shift and the second zero degrees. The first signal is fed to a second unity gain driver then to a differentiator amplifier by way of a variable capacitor which controls the gain of the differentiator amplifier to a predetermined magnitude. The second signal is fed through a predetermined delay chosen to exactly equal the propagation delay of the combination of the second driver and the differentiator amplifier. The differentiated signal and the delay signal are fed through a coupler for vectoral summation thereof. The output of the coupler is a linear function with respect to frequency.

DETAILED DESCRIPTION OF THE PREFERRED EMBODIMENT

Figure 1:
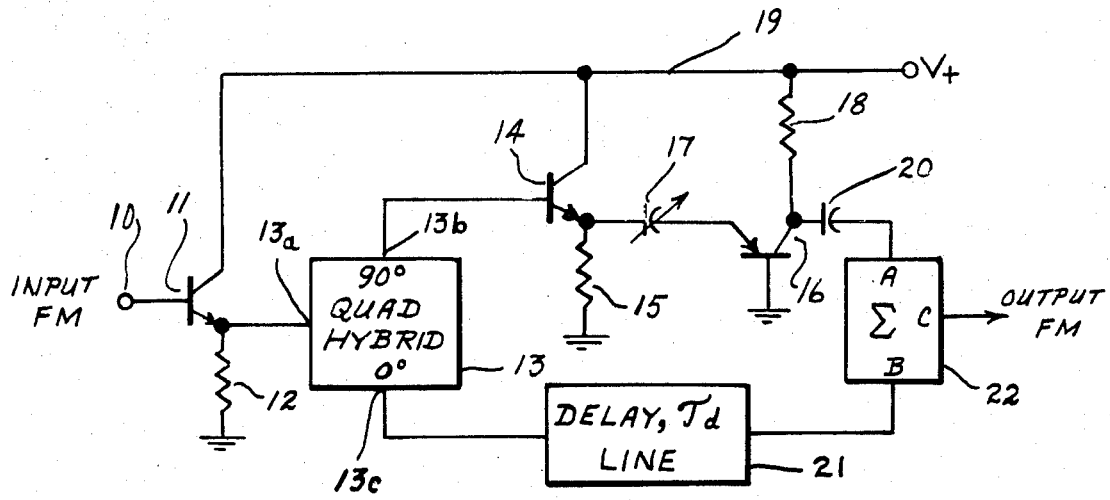
FIG. 1 shows partly in diagrammatic and partly in block form the linear filter network of a preferred embodiment.

Now referring in detail to FIG. 1, there is shown terminal 10 which receives an input FM signal for delivery to transistor driver 11 which operates as an emitter follower. Emitter resistor 12 is connected to ground. Transistor driver 11 serves as a buffer to conventional hybrid quadrature splitter 13. The output of transistor driver 11 is supplied to input port 13a of hybrid quadrature splitter 13. Hybrid quadrature splitter 13 splits the input signal thereto equally between two output ports 13b and 13c phased 90° apart. The 90° phased signal from port 13b is supplied to transistor driver 14 which is an emitter follower having unity gain. Emitter resistor 15 is connected to ground. Transistor driver 14 operates to drive differentiator amplifier 16. Collector resistor 18 is connected to voltage line 19. The gain K of differentiator amplifier 16 is set by the adjustment of variable capacitor 17 where $$K = \frac{R_c}{\frac{1}{WC_c}} = W C_c R_c .$$

It is noted that in the foregoing equation, $R_c$ is resistor 18 and $C_c$ is variable capacitor 17.

Figure 2:
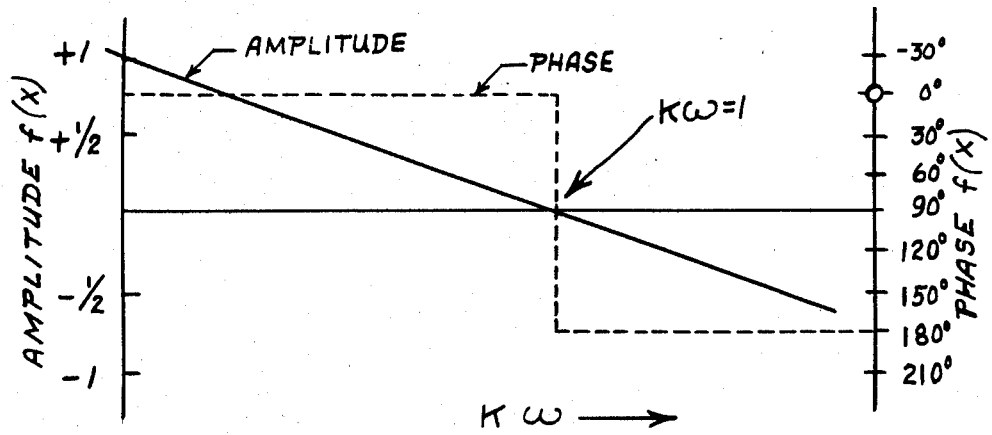
FIG. 2 shows the transfer function of the linear filter network.

The null frequency of the linear filter network as shown in FIG. 2 is related to the gain of differentiator amplifier 16. Thus the null frequency is selected by adjusting variable capacitor 17. The output of differentiator amplifier 16 is supplied to port A of conventional hybrid coupler 22. Hybrid coupler 22 vectorally sums signals applied to its input ports A and B, giving an output at port C.

The zero degree phased output signal from hybrid quadrature splitter 13 is passed through conventional delay line 21 to port B of hybrid coupler 22. The delay $\tau_d$ of delay line 21 is chosen to be exactly equal to the propagation delay of the combination of transistor driver 14 and differentiator amplifier 16 so as to restore the phase relationship of the two input signals prior to summation in hybrid coupler 22. The output of hybrid coupler 22 is a linear function with respect to frequency as shown graphically in FIG. 2.

In a more detailed description of the operation of the linear filter network, consider the input signal is represented by $F(X) = \sin WT$. $F(X)$ is first split in quadrature into two signals phased 90° apart, each ½ the input power:

$$F(X) = \frac{1}{\sqrt{2}} \sin WT \text{ and } \frac{1}{\sqrt{2}} \sin (W + 90)T \qquad \text{Eq. (1-a)}$$

where $1/\sqrt{2} \sin WT$ represents one component of $F(X)$ and output of the splitter while $1/\sqrt{2} \sin (W + 90) T$ represents the other component of $F(X)$ and output of the splitter. The $1/\sqrt{2}$ in both terms indicates an amplitude change with respect to the original input signal as a result of redistribution of the original energy in the splitting operation. Letting $A = 1/\sqrt{2}$ rewrite Equation (1-a) as follows:

$$F(X) = A \sin WT \text{ and } A \sin (W + 90°) T \qquad \text{Eq. (1-b)}$$

Looking at the second term of the right-hand side of Equation (1-b), note that $$\sin (W + 90°)T = \cos WT.$$

Substituting $\cos WT$ into Equation (1-b) there is obtained $$F(X) = A \sin WT \text{ and } A \cos WT \qquad \text{Eq. (1-c)}$$

Recalling that $A \sin WT$ and $A \cos WT$ in Equation (1-b) are independent signals (but directly related to one another in phase) at the output of the splitter, now operate on the terms independently. Differentiating the $A \cos WT$ term of Equation (1-c), there is obtained $$\frac{d A \cos WT}{dt} = AW \sin WT. \qquad \text{Eq. (2-a)}$$

Since the differentiation is done electronically there will be associated with the differentiation process a propagation delay and a gain which will be represented as $\tau_d$ and K, respectively. Thus, the output of the differentiation is equal to $$K(-AW \sin W(T+\tau_d)). \quad \text{Eq. (2-b)}$$

To preserve the phase relationship of Equation (2-b) with respect to $A \sin WT$ of Equation (1-c), the $A \sin WT$ term of Equation (1-c) must also be delayed an amount equal to $\tau_d$.

Passing the $A \sin WT$ term through a linear delay device whose delay equals $\tau_d$, there is obtained $$A \sin W(T+\tau_d). \quad \text{Eq. (3-a)}$$

Combining Equations (2-b) and (3-a) there is obtained the desired results:

$$F(X) = A \sin W(T+\tau_d) + AKW \sin W(T+\tau_d)$$

or $$F(X) = (1 - KW) A \sin W(T+\tau_d) \quad \text{Eq. (4)}$$

Electronically the summing is done in a linear summing network such as a hybrid coupler network. $F(X)$ is the transfer function of the linear filter. The term $K$ is the gain factor of the differentiator and is determined by the design of the differentiator. The term $(1 - KW)$ reflects the relative amplitude of the Sin term, and has a value which varies with $W$.

For $K = 1$, (neglecting the constant "$A$"), $F(X) = (1 - 1W) \sin W(T+\tau_d)$. Letting $W$ vary from 0 to 2 there is obtained the function shown in FIG. 2. The values of the functions for various values of $W$ are given hereafter with $F(X)$ as a function of $W$. With $W$ equal to 0, $(1 - KW)$ equals 1 and $F(X)$ equals 1 sin $W(T+\tau_d)$. With $W$ equal to ½, $(1 - KW)$ equals ½ and $F(X)$ equals ½ Sin $W(T+\tau_d)$. With $W$ equal to 1, $(1 - KW)$ equals 0 and $F(X)$ equals 0. Finally, with $W$ equal to 2, $(1-KW)$ equals $-1$ and $F(X)$ equals $$-1 \sin W(T+\tau_d) = \sin W(T+\tau_d) + 180°.$$

Note that as $KW \rightarrow 1$ then $F(X) \rightarrow 0$. When $KW > 1$, the phase of $F(X)$ changes 180°. The relationship between null frequency, (where $F(X) = 0$) and the product of $KW$ makes it practical to adjust $K$ for a null frequency that results in minimum demodulated noise.

What is claimed is:

1. A linear filter network with a linearly decreasing amplitude versus frequency characteristic and a concurrent linear phase response comprised of a phase splitter receiving an input FM signal and providing in response thereto two output signals of equal amplitude, the first having a 90° phase and the second zero degrees, an amplifier driver receiving said first output signal, a differentiator amplifier, a variable capacitor interconnecting said driver amplifier and said differentiator amplifier, the gain of said differentiator amplifier being set by the adjustment of said variable capacitor thereby selecting a preselected null frequency of said linear filter network, means to delay said second output signal a predetermined time exactly equal to the propagation delay of said driver amplifier and differentiator amplifier in combination so as to restore the phase relationship of said two output signals, and means to vectorally sum the delayed signal and the differentiated signal to provide a resultant signal having a linear function with respect to frequency.

2. A linear filter network as described in claim 1 wherein said means to sum vectorally is comprised of a hybrid coupler.

3. A linear filter network as described in claim 2 further including an emitter follower having unity gain and connected to the input of said hybrid quadrature splitter operating as a driver therefor.

* * * * *